US006762012B2

(12) United States Patent
Kim et al.

(10) Patent No.: US 6,762,012 B2
(45) Date of Patent: Jul. 13, 2004

(54) METHOD OF MANUFACTURING MONOLITHIC INK-JET PRINTHEAD

(75) Inventors: Tae-kyun Kim, Gyeonggi-do (KR);
Seo-hyun Cho, Gyeonggi-do (KR);
Myung-song Jung, Gyeonggi-do (KR);
Kyong-il Kim, Gyeonggi-do (KR);
Sung-joon Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/287,488

(22) Filed: Nov. 5, 2002

(65) Prior Publication Data

US 2003/0087199 A1 May 8, 2003

(30) Foreign Application Priority Data

Nov. 5, 2001 (KR) ........................................ 2001-68631

(51) Int. Cl.[7] .................................................. B41J 2/16
(52) U.S. Cl. .......................... 430/320; 430/394; 347/47
(58) Field of Search ................................ 430/320, 394; 347/47, 56

(56) References Cited

U.S. PATENT DOCUMENTS 6,162,589 A * 12/2000 Chen et al. ................. 430/320

6,303,274 B1 * 10/2001 Chen et al. ................. 430/320

* cited by examiner

*Primary Examiner*—John A. McPherson
(74) *Attorney, Agent, or Firm*—Staas & Halsey, LLP.

(57) ABSTRACT

A method of manufacturing a monolithic ink-jet printhead includes a heating element which generates bubbles by heating ink is formed on a surface of the substrate, and a negative photoresist which is coated to a predetermined thickness on the substrate on which the heating element is formed. Next, a portion, which forms a sidewall of an ink passage forming wall surrounding an ink chamber and a restrictor, of the negative photoresist is flush exposed to light and cured using a first photomask in which patterns of the ink chamber and the restrictor of the ink passage are formed. Subsequently, a second portion which forms an upper wall of the ink passage forming wall of the negative photoresist is exposed to the light using a second photomask in which the pattern of a nozzle is formed, and the second portion is exposed to the light by only a predetermined thickness. Last, an uncured portion of the negative photoresist is dissolved and removed using solvent. An ink-jet printhead whose elements are monolithically formed by a simplified process using a single negative photoresist can be manufactured.

24 Claims, 8 Drawing Sheets

METHOD OF MANUFACTURING MONOLITHIC INK-JET PRINTHEAD

CROSS-REFERENCE TO RELATED APPLICATIONS

This application claims the benefit of Korean Patent Application No. 2001-68631, filed Nov. 5, 2001, in the Korean Intellectual Property Office, the disclosure of which is incorporated herein by reference.

BACKGROUND OF THE INVENTION

1. Field of the Invention

The present invention relates to a method of manufacturing an ink-jet printhead, and more particularly, to a method of manufacturing a monolithic ink-jet printhead using a negative photoresist.

2. Description of the Related Art

In general, ink-jet printheads are devices for printing a predetermined color image by ejecting a small volume of a droplet of ink at a desired position on a recording sheet. In these ink-jet printheads, the ink is supplied to an ink chamber from an ink reservoir via an ink feed hole and a restrictor. The ink filled in the ink chamber is heated by a heating element provided in the ink chamber and is ejected in a droplet shape through nozzles by a pressure of bubbles generated by the heating element.

In general, the ink-jet printheads require a structure in which a number of nozzles are highly integrated, as the ink-jet printheads realize high resolution and high speed printing. In this case, a shape and precision of each nozzle and uniformity and precision between cells of the ink passage are the most important process variables for improving printing performances and realizing high quality images.

FIGS. 1A through 1H are cross-sectional views illustrating a conventional method of manufacturing an ink-jet printhead using a roof shooting method. Basically, a photolithography process and an electro forming process are used in the method of manufacturing the ink-jet printhead using the roof shooting method.

The method of manufacturing the ink-jet printhead using the roof shooting method includes manufacturing a nozzle plate 15 as shown in FIGS. 1A through 1D, forming an ink passage including an ink feed hole 22, a restrictor 27, and an ink chamber 26 on a head chip substrate 21 on which a heating element 23 is formed as shown in FIGS. 1E through 1G, and attaching the nozzle plate 15 to the head chip substrate 21 to complete the ink-jet printhead as shown in FIG. 1H.

More specifically, a seeding layer 12 for the electro forming process is formed on a silicon substrate 11 as shown in FIG. 1A, and positive photoresist 13 is coated on the seeding layer 12. That is, the seeding layer 12 is formed to a thickness of several thousand Å by sputtering or depositing NiV on the silicon substrate 11. The positive photoresist 13 is coated to a thickness of about several $\mu$m, i.e., usually to a thickness between 4 $\mu$m and 8 $\mu$m, through spin coating. Subsequently, the positive photoresist 13 is selectively exposed to a beam hv using a photomask 14.

Subsequently, the exposed photoresist 13 is developed. In this case, only a remaining photoresist 13a of an unexposed portion of the positive photoresist 13 remains on the seeding layer 12 as shown in FIG. 1B. A crater 15b will be formed by the remaining photoresist 13a around a nozzle 15a shown in FIG. 1D.

FIG. 1C illustrates a case where the nozzle plate 15 of nickel is formed on the seeding layer 12 by soaking the patterned substrate 11 in a plating container and performing the electro forming process. In this case, the nozzle plate 15 can be formed to a desired thickness by adjusting a total current density and a plating time applied to the plating container. Simultaneously, plating is suppressed on the remaining photoresist 13a, and thus the nozzle 15a is formed.

After the electro forming process is completed, the nozzle plate 15 is separated from the substrate 11 and is cleaned as shown in FIG. 1D. In this case, the crater 15b is formed by the remaining photoresist 13a around the nozzle 15a.

FIG. 1E illustrates a case where a negative photoresist 24 is coated on the head chip substrate 21 on which the heating element 23 formed of a resistance heating body and the ink feed hole 22 are formed. The negative photoresist 24 is coated on the head chip substrate 21 by a lamination method of heating and pressurizing and compressing a dry film resist of resin, such as VACREL or RISTON manufactured by DUPONT, on the head chip substrate 21.

Subsequently, the negative photoresist 24 is selectively exposed to the beam hv using a second photomask 25 as shown in FIG. 1F. As a result, an exposed portion of the negative photoresist 24 is cured, and a barrier wall 24a surrounding the ink chamber 26 is formed as shown in FIG. 1G. An unexposed portion of the negative photoresist 24 is removed using solvent, and thus the ink chamber 26 and a restrictor 27 are formed. The restrictor 27 is a connection path formed between the ink feed hole 22 and the ink chamber 26.

Last, the previously-manufactured nozzle plate 15 is heated and pressurized on the barrier wall 24a and is attached to the head chip substrate 21, thereby the ink-jet printhead is manufactured as shown in FIG. 1H.

The above-mentioned method of manufacturing a nozzle plate is well known as a Mandrel type nozzle electro forming method. At present, many manufactures employ the method in manufacturing a color ink-jet printhead and a mono ink-jet printhead having a small number of nozzles.

However, the method shown in FIGS. 1A through 1H causes many problems as the integration of a cell marked by cell per inch (CPI) and the number of the nozzles 15a increase. First, since the nozzle plate 15 should be separately manufactured and attached to the head chip substrate 21, high precision is necessary in this process. Second, misalignment between the nozzle 15a and the heating element 23 may occur because thermal expansion coefficients of the nozzle plate 15 and the head chip substrate 21 are different from each other when the nozzle plate 15 is heated and attached to the head chip substrate 21. Third, since one electro forming process, two photolithography processes, and one adhesion process should be performed, a process of manufacturing the ink-jet printhead becomes very complicated.

Accordingly, another method of manufacturing the ink-jet printhead by monolithically forming elements, such as the ink passage and the nozzle, on the head chip substrate has been recently introduced.

FIG. 2 is a perspective view of a conventional ink-jet printhead using a side shooting method, and FIGS. 3A through 3E are cross-sectional views illustrating a method of monolithically manufacturing the ink-jet printhead shown in FIG. 2. Drawings on the left side of FIGS. 3A through 3E are cross-sectional views taken along line A—A of FIG. 2, and drawings on the right side of FIGS. 3A through 3E are cross-sectional views taken along line B—B of FIG. 2. A photolithography process is basically used in the method, but the electro forming process and the adhesion process are not used in this method.

Referring to FIG. 2, the conventional ink-jet printhead using the side shooting method has a structure in which an ink passage forming wall 41 forming an ink feed hole 45, an ink chamber 42, and an ink passage 43 are stacked on a head chip substrate 31. A heating element 32 is formed at one side of the ink passage 43, i.e. in a portion adjacent to the ink chamber 42, and a nozzle 44 is formed at the other side of the ink passage 43.

The method of monolithically manufacturing the ink-jet printhead having the above structure will be described stepwise below.

A positive photoresist 33 is coated to a thickness of about several ten μm on the head chip substrate 31 on which the heating element 32 of a resistance heating body is formed as shown in FIG. 3A. Subsequently, the positive photoresist 33 is selectively exposed to a beam hv using a photomask 34.

Next, the exposed photoresist 33 is developed. In this case, only a remaining photoresist 33a of an unexposed portion of the positive photoresist 33 remains on the head chip substrate 31 as shown in FIG. 3B. The ink chamber 42 and the ink passage 43 shown in FIG. 2 will be formed by the remaining photoresist 33a.

Next, a photocurable polymer 34 cured by heat or light is coated on the head chip substrate 31 and the remaining photoresist 33a as shown in FIG. 3C. Subsequently, if ultraviolet (UV) is flush exposed to (radiated on) the photocurable polymer 34 as shown in FIG. 3D, an exposed portion of the photocurable polymer 34 is cured, and thus an ink passage forming wall 41 is formed. A portion of the remaining photoresist 33a is exposed to an outside of the ink passage forming wall 41 by cutting the ink passage forming wall 41 of FIG. 3D along line C—C of FIG. 3D.

Referring to FIG. 3E, if the remaining photoresist 33a is dissolved using solvent, the ink chamber 42, the ink passage 43, and the nozzle 44 are formed. Meanwhile, the ink feed hole 45 is formed before the remaining photoresist 33a is removed using solvent. As a result, the ink-jet printhead using the side shooting method shown in FIG. 2 is manufactured.

The above-mentioned method of manufacturing the ink-jet printhead is a method of monolithically forming the ink passage and the nozzle on the head chip substrate. Accordingly, in absence of the electro forming process and the adhesion process, the method might have an advantage that a process simpler than that of the method shown in FIGS. 1A through 1H is performed. In addition, since the ink passage, the nozzle, and the heating element are aligned by the photolithography process, the misalignment might not occur, and thus the uniformity between cells and the printing performances might be improved. However, there is a limit in manufacturing the ink-jet printhead since the method can be implemented only in the ink-jet printhead using the side shooting method. Further, since the method requires a cutting process, the nozzle and the ink passage may be clogged by dust and particles occurring in the cutting process, and the shape of the photocurable polymer for forming the ink passage may be deformed during the cutting process.

SUMMARY OF THE INVENTION

To solve the above and other problems, it is an object of the present invention to provide a method of forming a monolithic ink-jet printhead having an improved structure in which elements, such as a nozzle and an ink passage, are monolithically formed on a substrate using a single negative photoresist and thus a process of manufacturing the ink-jet printhead is simplified.

Additional objects and advantageous of the invention will be set forth in part in the description which follows and, in part, will be obvious from the description, or may be learned by practice of the invention.

Accordingly, to achieve the above and other objects, there is provided a method of manufacturing a monolithic ink-jet printhead in which an ink passage, which supplies ink from an ink reservoir to an ink chamber, and a nozzle, through which the supplied ink is ejected, are monolithically formed on a substrate. The method includes forming a heating element, which generates bubbles by heating ink, on a surface of the substrate, coating a negative photoresist to a predetermined thickness on the substrate on which the heating element is formed, first exposing the negative photoresist to light by flush exposing to cure a portion, which forms a sidewall of an ink passage forming wall surrounding the ink chamber and a restrictor, of the negative photoresist using a first photomask in which patterns of the ink chamber and the restrictor of the ink passage are formed, second exposing the negative photoresist to the light by exposing a portion, which forms an upper wall of the ink passage forming wall, of the negative photoresist to cure the portion to only a predetermined second thickness using a second photomask in which a pattern of the nozzle is formed, and dissolving and removing an uncured portion of the negative photoresist using solvent in the first exposing and the second exposing.

When the negative photoresist is a dry film resist, etching the substrate to form an ink feed hole is performed between the forming of the heating element and the coating of the negative photoresist. When the negative photoresist is a liquid, etching the substrate to form the ink feed hole is performed between the second exposing and the removing of the uncured portion from the negative photoresist.

According to the present invention, the ink-jet printhead whose elements are monolithically formed by a simplified process using a single negative photoresist can be manufactured. Also, when the substrate is a silicon wafer, this is effective in mass production.

In the forming of the heating element, the heating element is formed on the substrate by sputtering metal as a resistance heating body or by depositing an impurity-doped polysilicon layer through chemical vapor deposition and patterning the impurity-doped polysilicon layer.

It is possible that the negative photoresist includes at least one selected from a group of epoxy-family, polyimide-family, and polyacrylate-family, and the coating thickness of the negative photoresist is between 10 μm and 100 μm.

It is also possible that when the negative photoresist is the dry film resist, the negative photoresist is coated on the substrate through lamination, and when the negative photoresist is the liquid, the negative photoresist is coated on the substrate through spin coating.

It is also possible that a dose in the first exposing is between 1000 mJ/cm² and 4000 mJ/cm², and the dose in the second exposing is between 2 mJ/cm² and 300 mJ/cm². Here, heights of the ink passage and the nozzle are adjusted by the dose in the second exposing.

BRIEF DESCRIPTION OF THE DRAWINGS

These and other objects and advantageous of the invention will become apparent and more readily appreciated from the following description of the preferred embodiments, taken in conjunction with the accompanying drawings of which.

DETAILED DESCRIPTION OF THE PREFERRED EMBODIMENTS

Figure 1A:
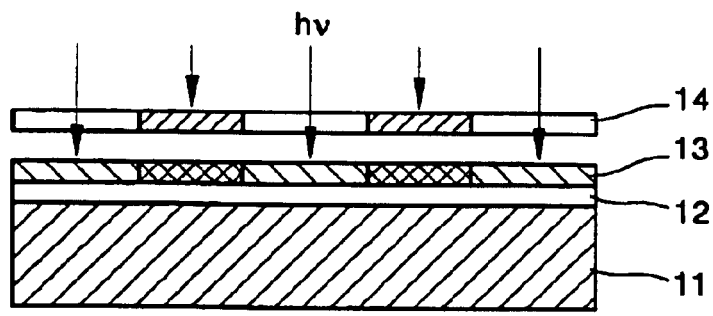
FIGS. 1A through 1H are cross-sectional views of a conventional method of manufacturing an ink-jet printhead using a roof shooting method.
Figure 1B:
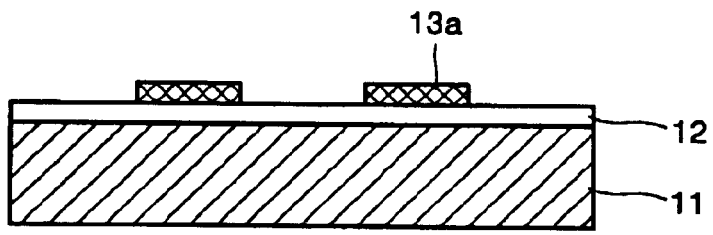
Figure 1C:
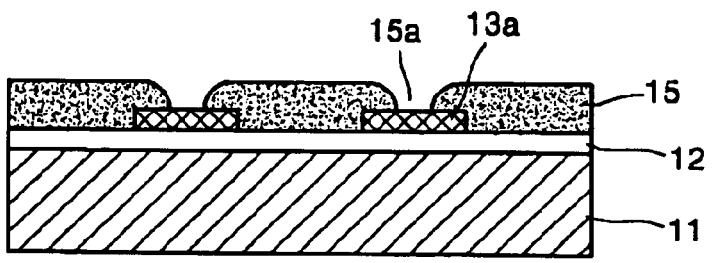
Figure 1D:
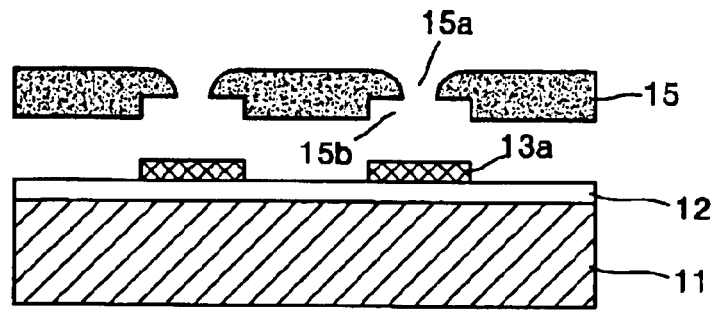
Figure 1E:
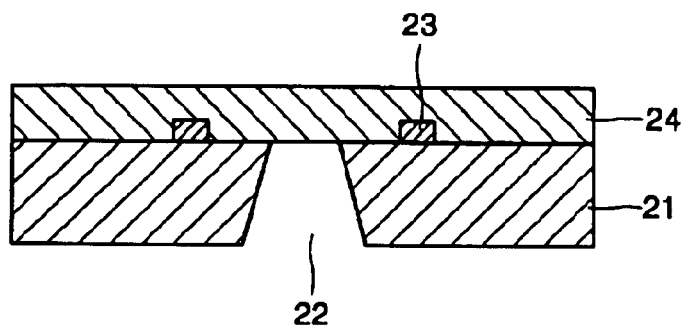
Figure 1F:
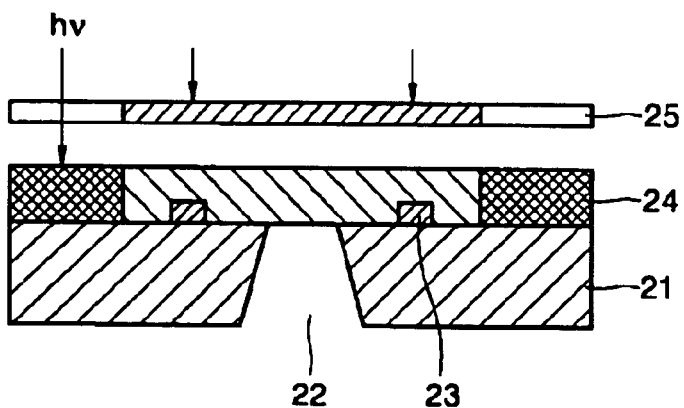
Figure 1G:
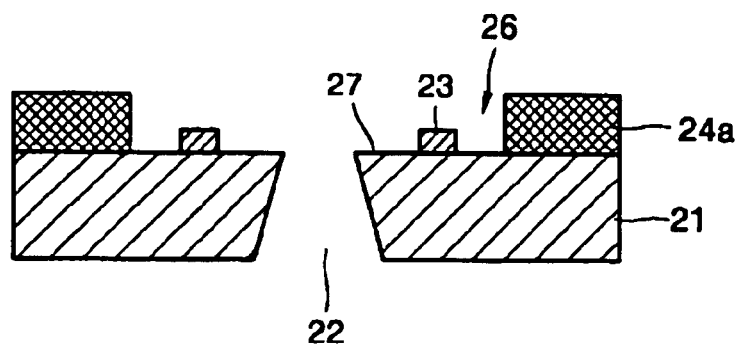
Figure 1H:
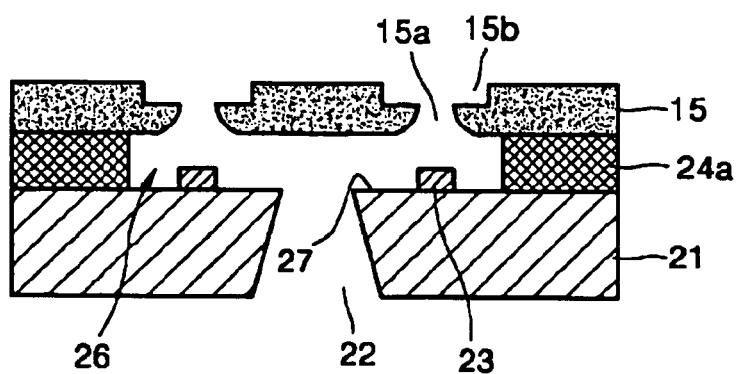
Figure 2:
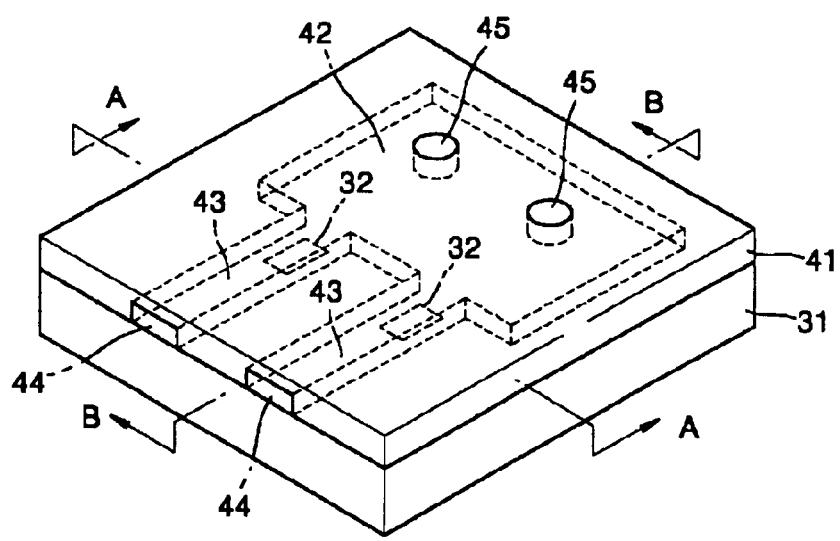
FIG. 2 is a perspective view of a conventional ink-jet printhead using a side shooting method.
Figure 3A:
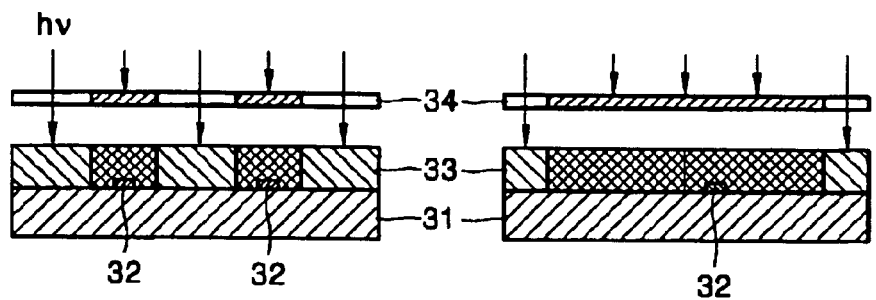
FIGS. 3A through 3E are cross-sectional views illustrating a method of monolithically manufacturing the ink-jet printhead shown in FIG. 2.
Figure 3B:
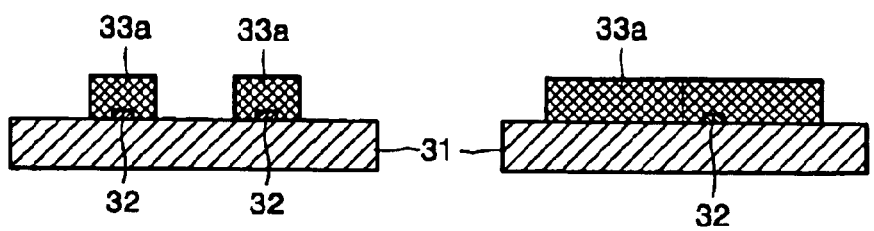
Figure 3C:
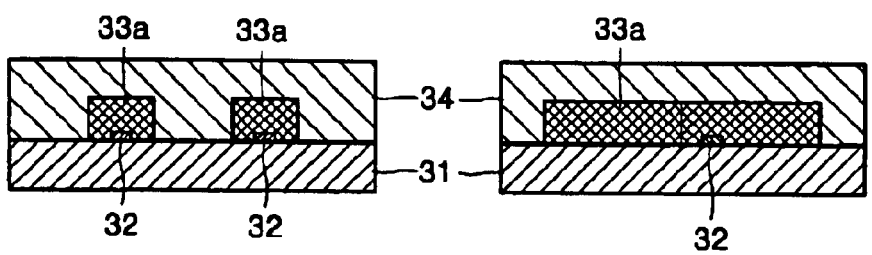
Figure 3D:
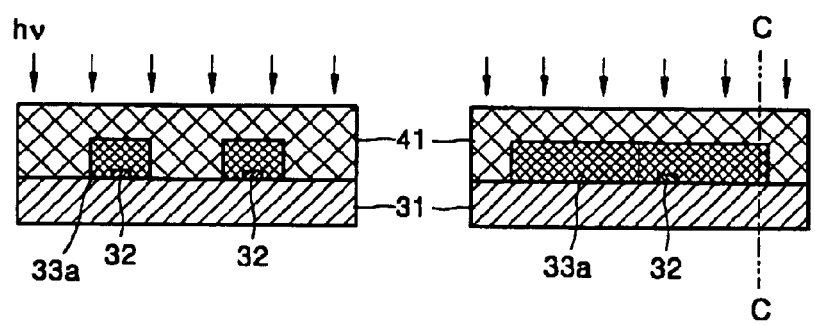
Figure 3E:
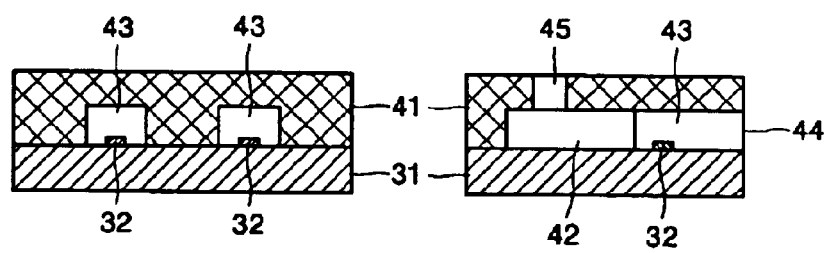

Reference will now be made in detail to the present preferred embodiment of the present invention, examples of which are illustrated in the accompanying drawings, wherein like reference numerals refer to the like elements throughout. The embodiment is described in order to explain the present invention by referring to the figures.

This invention may, however, be embodied in many different forms and should not be construed as being limited to the embodiments set forth herein. It will be understood that when a layer is referred to as being on another layer or on a substrate, it can be directly on the other layer or on the substrate, or intervening layers may also be present.

FIGS. 4A through 4E are cross-sectional views illustrating a method of manufacturing a monolithic ink-jet printhead according to an embodiment of the present invention.

A photolithography process is basically used in the method of manufacturing the monolithic ink-jet printhead. However, an electro forming process, an adhering process, and a cutting process are not used, unlike the prior art.

Figure 4A:
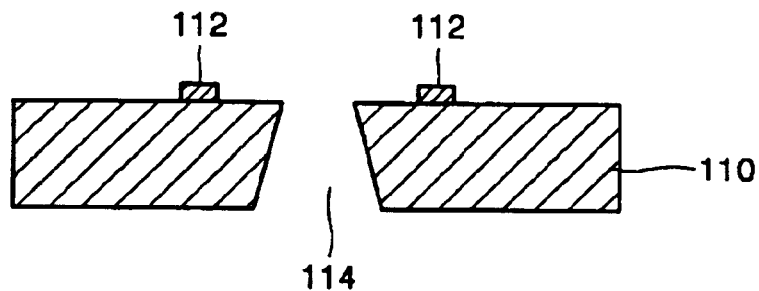
FIGS. 4A through 4E are cross-sectional views illustrating a method of manufacturing a monolithic ink-jet printhead according to an embodiment of the present invention.
Figure 4B:
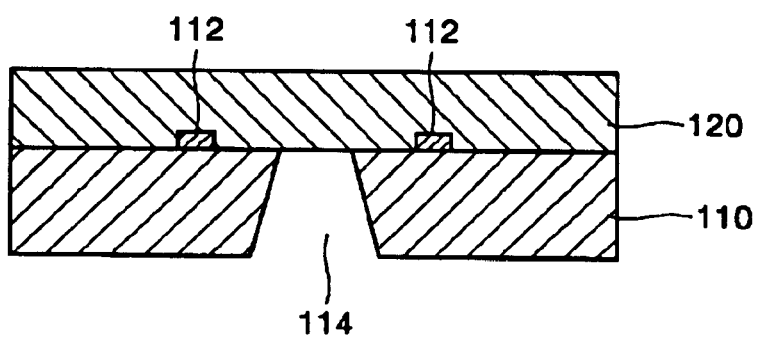
Figure 4C:
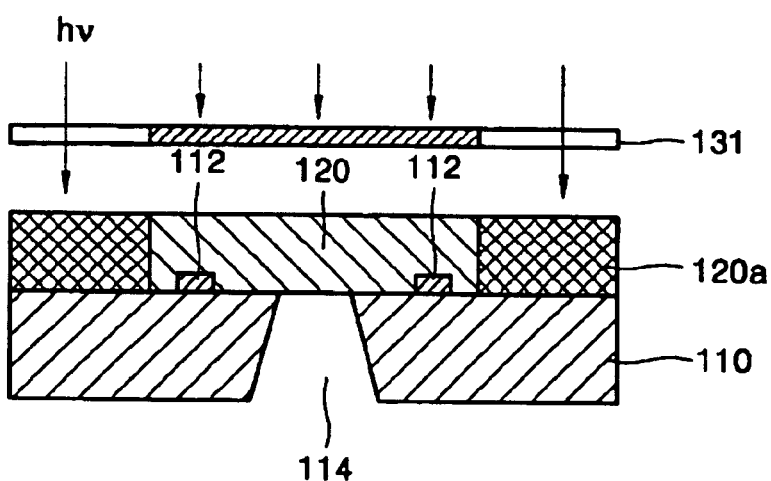
Figure 4D:
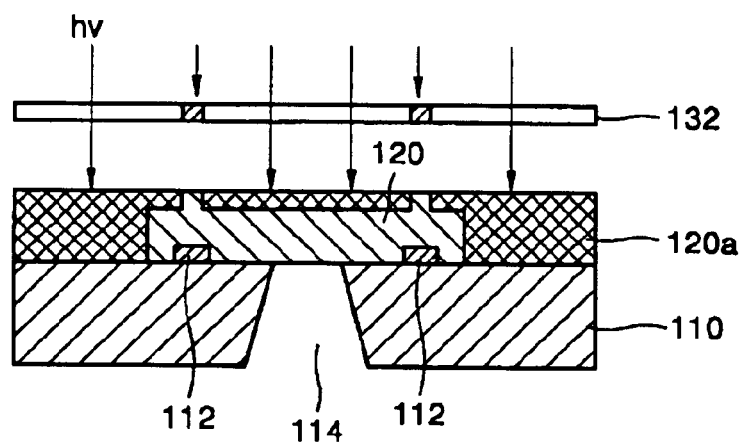
Figure 4E:
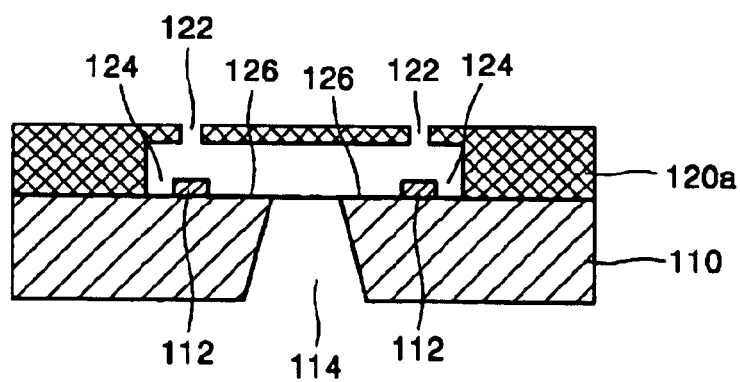

The method of manufacturing the monolithic ink-jet printhead includes forming a heating element 112 on a head chip substrate 110 as shown in FIG. 4A, forming an ink passage forming wall 120a on the head chip substrate 110 using a photolithography process as shown in FIGS. 4B through 4D, and completing the ink-jet printhead whose elements are monolithically formed on the head chip substrate 110 as shown in FIG. 4E.

More specifically, the heating element 112 generating bubbles by heating ink and an ink feed hole 114 receiving ink from an ink reservoir (not shown) are formed on the substrate 110 as shown in FIG. 4A.

Here, a silicon substrate is used for the head chip substrate 110. This is because a silicon wafer is widely used to manufacture semiconductor devices and thus is effective in mass production of the head chip substrate 110 of the ink-jet printhead.

The heating element 112 may be formed as a resistance heating body by sputtering a metal, such as tantalum-aluminum alloy, on the substrate 110 or by depositing an impurity-doped polysilicon layer on the substrate 110 and patterning the impurity-doped polysilicon layer. When the heating element 112 is formed of polysilicon, the polysilicon is deposited on an entire surface of the substrate 110 with impurities, i.e. a source gas of phosphorus (P), through low pressure chemical vapor deposition (LP CVD), and then, a deposited polysilicon layer is patterned by a photolithography process using a photomask and a photoresist and by an etch process using a photoresist pattern as an etch mask.

Subsequently, the ink feed hole 114 is formed by etching a bottom surface of the substrate 110. Specifically, if an etch mask defining a region to be etched is formed on the bottom surface of the substrate 110, and the region is wet or dry etched, the ink feed hole 114 is formed. In this case, if the region is wet etched using tetramethyl ammonium hydroxide (TMAH) as an etchant, the ink feed hole 114 having a predetermined slope can be formed as shown in FIG. 4A.

While it has been already described that the ink feed hole 114 is formed in an operation shown in FIG. 4A, the ink feed hole 114 may be formed in another operation shown in FIG. 4D as described later. Specifically, when a negative photoresist 120 of a dry film resist that is dried and filmed as shown in FIG. 4B, is used, the ink feed hole 114 may be formed before the photolithography process is performed, as described above. However, when a liquid photoresist is used as the negative photoresist, the ink feed hole 114 is formed by etching the substrate 110 after the photolithography process is performed as shown in FIG. 4D, i.e., after the ink passage forming wall 120a is formed by curing the liquid photoresist.

FIG. 4B illustrates a case where the negative photoresist 120 is coated on the head chip substrate 110 on which the heating element 112 is formed. Epoxy-family, polyimide-family or polyacrylate-family photoresist resin may be used for the negative photoresist 120. For example, SU-8 manufactured by MICROCHEM CORPORATION, a polyimide-family photoresist manufactured by DUPONT or a negative dry film resist manufactured by TOK and JSR may be used for the negative photoresist 120.

If the negative photoresist 120 is exposed to light hv, the negative photoresist 120 has a property in which a low molecular weight is changed to a high molecular weight, and the negative photoresist 120 is cured by a network structure formed by a high molecular chain. In addition, a cross linking density of the network structure and a depth of a cross-linked layer can be adjusted by adjusting an amount of exposure to the light hv. A cured portion of the negative photoresist 120 represents a chemical resistance and high mechanical strength. An uncured portion of the negative photoresist 120 exists in a low molecular weight, i.e. in a monomer or oligomer state, and is easily dissolved by a developer, such as acetone, halogen-containing solvent, and alkaline solvent.

Since there are a variety of heights of an ink chamber (124 of FIG. 4E) and various sizes of a restrictor (126 of FIG. 4E) which correspond to an amount of droplets depending on a resolution, the negative photoresist 120 may be coated to a thickness of about between 10 $\mu$m and 100 $\mu$m so as to satisfy these variety of dimensions of the ink chamber 124 and the restrictor 126. When the negative photoresist 120 is the dry film resist, the negative photoresist 120 is coated on the head chip substrate 110 by a lamination method of heating, pressurizing and compressing the dry film resist. When the negative photoresist 120 is the liquid, the liquid is coated on the head chip substrate 110 through spin coating.

Subsequently, using the above-mentioned property of the negative photoresist 120, the negative photoresist 120 is selectively exposed to the light hv using a first photomask 131 protecting a portion in which the ink passage is to be formed as shown in FIG. 4C. In this case, an exposed portion of the negative photoresist 120 is flush exposed by a dose of several thousand mJ/cm$^2$, preferably, between 1000 mJ/cm$^2$ and 4000 mJ/cm$^2$. As a result, the flush exposed portion of the negative photoresist 120 is changed to high molecule having the network structure with the high cross linking density and cured such that the flush exposed portion of the negative photoresist 120 has the chemical resistance and the high mechanical strength. The portion cured through flush exposure forms a sidewall of the ink passage forming wall 120a surrounding the ink chamber 124 and the restrictor 126.

Subsequently, the negative photoresist 120 is exposed to the light hv using a second photomask 132 protecting a portion in which a nozzle is to be formed, as shown in FIG. 4D. In this case, an exposed portion of the negative photoresist 120 is shallow exposed by the dose smaller than that of the operation shown in FIG. 4C. An amount of radiation of the light hv, i.e., a transmission depth of ultraviolet UV, may vary depending on a type of materials, a transparency and a thickness of a photoresist. Thus, the dose may vary in a range of between several $mJ/cm^2$ and several hundred $mJ/cm^2$, preferably, between 2 $mJ/cm^2$ and 300 $mJ/cm^2$, depending on the negative photoresist 120. When the exposed portion of the negative photoresist 120 is shallow exposed, cross linking occurs on a surface of the negative photoresist 120 near a light source, and thus high molecular curing occurs. However, the cross linking caused by the light hv does not occur in a deep portion of the negative photoresist 120, and thus the deep portion of the negative photoresist 120 exists in a monomer or oligomer state. Thus, only a predetermined thickness of an upper portion of the negative photoresist 120 other than a portion in which a nozzle (122 of FIG. 4E) is to be formed, is cured through the exposure such that an upper wall of the ink passage forming wall 120a surrounding the ink chamber (124 of FIG. 4E) and the restrictor (126 of FIG. 4E) is formed. In this case, the heights of the ink chamber, the restrictor, and the nozzle may be adjusted by the dose of the light. That is, the thickness of the cured portion of the negative photoresist 120 varies by adjusting the dose of the light hv, and thus the heights of the ink chamber, the restrictor, and the nozzle vary.

When the negative photoresist 120 is the liquid, the ink feed hole 114 can be formed after the above-mentioned ink passage forming wall 120a is formed and completed.

According to the present invention, elements of the ink-jet printhead are constituted by using single negative photoresist 120 and exposing the negative photoresist 120 twice, whereas elements of a conventional ink-jet printhead are constituted by using two types of photoresist in the prior art.

Last, the uncured portion of the negative photoresist 120 is dissolved and removed using the above-mentioned solvent as shown in FIG. 4E. As a result, the ink chamber 124, the restrictor 126, and the nozzle 122 that are surrounded by the ink passage forming wall 120a are formed, thereby the monolithic ink-jet printhead using a roof shooting method is completed.

Although the preferred embodiment of the present invention is described in detail as above, the scope of the present invention is not limited to this but various changes and other embodiments may be made. For example, although the method of manufacturing the monolithic ink-jet printhead according to the present invention is applied to the ink-jet printhead using the roof shooting method, the fundamental technical spirit of the present invention may be applied to the ink-jet printhead using another shooting method and may be further applied to an apparatus controlling a flow of a fluid by a pressure generated by a MEMS sensor and an actuator using a flow property of the fluid.

In addition, not shown materials may be used for materials used in constituting each element of the ink-jet printhead in the present invention. That is, the substrate may be formed of another material with a good processing property other than silicon.

In addition, in the method of manufacturing a monolithic ink-jet printhead of the present invention, an order of operations may vary according to occasional demands. For example, as described above, the etching of substrate to form the ink feed hole may be performed in the operation shown in FIG. 4D as well as in the operation shown in FIG. 4A.

Further, specific dimensions shown in operations in FIGS. 4A through 4E can be adjusted within a range in which the monolithic ink-jet printhead can normally operate according to the occasional demands.

As described above, the method of manufacturing a monolithic ink-jet printhead according to the present invention has the following advantages.

First, elements, such as the ink feed hole, the restrictor, the ink chamber, and the nozzle, can be monolithically formed on the head chip substrate by the photolithography process without performing the electro forming process, the adhering process, and the cutting process which are performed in the prior art. In addition, the photolithography process can be performed using a single negative photoresist, whereas the photolithography process is performed using two or more types of photoresist in the prior art. Thus, according to the present invention, a process of manufacturing the ink-jet printhead is simplified, thereby reducing manufacturing time and costs.

Second, because of the photolithography process, a fine shape of the ink passage or nozzle can be formed to have optimum design dimensions. Thus, dimension precision and uniformity between cells are improved, and thus high resolution and high speed printing performances can be realized. Further, the height of the ink chamber and a diameter of the nozzle can vary by adjusting the dose of the light and deforming the photomask.

Third, since there is no adhering process in the present invention, defects, such as a misalignment caused by inconsistency of thermal expansion coefficients between elements which may occur during the adhering process, and damages caused by a residual stress are removed, and thus a production yield is increased. Walls defining the ink chamber and the nozzle are seamlessly formed, and a seamed portion is not formed between the walls in the monolithic negative photoresist. In addition, according to the present invention, there are no cleaning process and cutting process of a nozzle plate after a plating process, and dust or foreign particles which cause the ink passage and the nozzle to be clogged, are not formed.

While this invention has been particularly shown and described with reference to preferred embodiments thereof, it will be understood by those skilled in the art that various changes in form and details may be made therein without departing from the spirit and scope of the invention as defined by the appended claims and their equivalents.

What is claimed is:

1. A method of manufacturing a monolithic ink-jet printhead in which an ink passage which receives ink from an ink reservoir, and a nozzle through which ink is ejected, are monolithically formed on a substrate, the method comprising:

forming a heating element which generates bubbles by heating the ink, on a surface of the substrate;

coating a negative photoresist to a first thickness on the substrate on which the heating element is formed;

first exposing the negative photoresist to light to cure a first portion which forms a sidewall of an ink passage forming wall surrounding an ink chamber and a restrictor, of the negative photoresist using a first photomask in which patterns of the ink chamber and the restrictor of the ink passage are formed;

second exposing the negative photoresist to the light to cure a second portion which forms an upper wall of the ink passage forming wall of the negative photoresist to a second thickness using a second photomask in which a pattern of the nozzle is formed; and dissolving and removing an uncured portion of the negative photoresist, which is formed in operations of the first exposing and the second exposing of the negative photoresist, using solvent.

2. The method of claim 1, wherein the negative photoresist comprises a dry film resist, and the forming of the heating element and the coating of the negative photoresist comprises:

etching the substrate to form an ink feed hole communicating with the ink passage.

3. The method of claim 1, wherein the negative photoresist comprises a liquid, and the second exposing of the negative photoresist and the removing of the uncured portion comprise:

etching the substrate to form an ink feed hole communicating with the ink passage.

4. The method of claim 1, wherein the substrate is a silicon wafer.

5. The method of claim 1, wherein the forming of the heating element comprises:

sputtering a metal as a resistance heating body on the substrate.

6. The method of claim 1, wherein the forming of the heating element comprises:

depositing an impurity-doped polysilicon layer through chemical vapor deposition and patterning the impurity-doped polysilicon layer on the substrate.

7. The method of claim 1, wherein the negative photoresist comprises at least one of epoxy-family, polyimide-family, and polyacrylate-family.

8. The method of claim 1, wherein a coating thickness of the negative photoresist is between 10 $\mu$m and 100 $\mu$m.

9. The method of claim 1, wherein the negative photoresist comprises a dry film resist, and the coating of the negative photoresist comprises:

laminating the dry film resist on the substrate.

10. The method of claim 1, wherein the negative photoresist comprises a liquid, and the coating of the negative photoresist comprises:

performing a spin coating process of coating the liquid on the substrate.

11. The method of claim 1, wherein a dose of the light in the first exposing is between 1000 mJ/cm$^2$ and 4000 mJ/cm$^2$.

12. The method of claim 1, wherein a dose of the light in the second exposing of the negative photoresist is between 2 mJ/cm$^2$ and 300 mJ/cm$^2$.

13. The method of claim 1, wherein heights of the ink passage and the nozzle are adjusted by a dose of the light in the second exposing of the negative photoresist.

14. A method of manufacturing a monolithic ink-jet printhead, the method comprising:

forming a heating element on a surface of a substrate;

coating a negative photoresist on the surface of the substrate and the heating element;

first exposing the negative photoresist to first light using a first photomask having a first pattern corresponding to an ink chamber and a restrictor;

second exposing the negative photoresist to second light using a second photomask having a second pattern corresponding to a nozzle; and removing a portion of the negative photoresist corresponding to the ink chamber, the resistor, and the nozzle from the negative photoresist.

15. The method of claim 14, wherein the first exposing of the negative photoresist comprises:

curing the negative photoresist to a first thickness equal to a thickness of the negative photoresist in a direction parallel to an ink ejecting direction.

16. The method of claim 14, wherein the second exposing of the negative photoresist comprises:

curing the negative photoresist to a second thickness less than a thickness of the negative photoresist in a direction parallel to an ink ejecting direction.

17. The method of claim 14, wherein a dose of the first light is greater than that of the second light.

18. The method of claim 14, wherein the first exposing of the negative photoresist comprises:

forming a wall defining the ink chamber and the restrictor in the negative photoresist.

19. The method of claim 14, wherein the second exposing of the negative photoresist comprises:

forming a wall defining the nozzle in the negative photoresist.

20. The method of claim 14, wherein the first exposing of the negative photoresist comprises:

forming a low molecular chain corresponding to the ink chamber and a high molecular chain forming a wall defining the ink chamber in the negative photoresist.

21. The method of claim 14, wherein the second exposing of the negative photoresist comprises:

forming a low molecular chain corresponding to the nozzle and a high molecular chain defining the nozzle in the negative photoresist.

22. The method of claim 14, wherein the first exposing of the negative photoresist comprises:

adjusting a first dose of the first light to adjust a height of the ink chamber.

23. The method of claim 22, wherein the second exposing of the negative photoresist comprises:

adjusting a second dose of the second light to adjust a height of the nozzle.

24. A method of manufacturing a monolithic ink-jet printhead, the method comprising:

forming a heating element on a surface of a substrate;

coating a negative photoresist on the substrate and the heating element;

radiating a first light on the negative photoresist through a first photomask having a first pattern corresponding to the ink chamber; and radiating a second light on the negative photoresist through a second photomask having a second pattern corresponding to a nozzle; and removing a portion of the negative photoresist corresponding to the ink chamber and the nozzle from the negative photoresist.

* * * * *